United States Patent [19]
Wistrand

[11] Patent Number: 6,061,639
[45] Date of Patent: May 9, 2000

[54] BATTERY CAPACITY MEASURING DEVICE

[75] Inventor: Per Wistrand, Storängsstigen, Sweden

[73] Assignee: Telefonaktiebolaget LM Ericsson, Stockholm, Sweden

[21] Appl. No.: 08/981,504

[22] PCT Filed: Apr. 29, 1997

[86] PCT No.: PCT/SE97/00723

§ 371 Date: Dec. 29, 1997

§ 102(e) Date: Dec. 29, 1997

[87] PCT Pub. No.: WO97/41448

PCT Pub. Date: Nov. 6, 1997

[30] Foreign Application Priority Data

Apr. 29, 1996 [SE] Sweden .................................. 9601639

[51] Int. Cl.[7] .................................................. G01R 31/36
[52] U.S. Cl. ................................ 702/63; 702/66; 702/71; 324/427; 340/636
[58] Field of Search ................................. 702/63, 64, 65, 702/66, 67, 71; 324/427, 426, 430, 431; 340/636

[56] References Cited

U.S. PATENT DOCUMENTS

| | | | |
|---|---|---|---|
| 4,952,862 | 8/1990 | Biagetti et al. | 324/427 |
| 5,371,682 | 12/1994 | Levine et al. | 364/483 |
| 5,394,089 | 2/1995 | Clegg | 324/427 |
| 5,847,566 | 12/1998 | Marritt et al. | 702/63 |

FOREIGN PATENT DOCUMENTS

| | | | |
|---|---|---|---|
| 0 420 530 | 4/1991 | European Pat. Off. | G01R 31/36 |
| WO90/06522 | 6/1990 | WIPO | G01R 31/36 |
| WO91/08494 | 6/1991 | WIPO | G01R 31/36 |

OTHER PUBLICATIONS

PCT International Search Report re: PCT/SE97/00723 dated Aug. 12, 1997.

*Primary Examiner*—Marc S. Hoff
*Assistant Examiner*—Hien Vo
*Attorney, Agent, or Firm*—Burns, Doane, Swecker & Mathis, L.L.P.

[57] ABSTRACT

The present invention provides a fast, simple and accurate method for determining remaining battery capacity by taking into account the measured discharge parameters, such as voltage and current, which determine the shape of discharge curves for several different discharge currents. By normalizing the measured values, a normalized table is created that is used as a starting point for retrieving the remaining capacity in a battery at an arbitrary discharge current.

10 Claims, 7 Drawing Sheets

BATTERY CAPACITY MEASURING DEVICE

TECHNICAL FIELD

The present invention relates to a method and a device to predict the resulting capacity of a battery.

STATE OF THE ART

The possibility to estimate the remaining energy content in a battery being discharged, is desirable, as the information may be used to determine the remaining operational time of the battery before it must be recharged or replaced.

There are several different ways of achieving this, and in the patent specification EP 0420530 the estimate of the time for the discharge of the battery is based on a discharge curve being divided into one linear and one exponential part, and on a measured plateau voltage. This, combined with a real time supervision of the dynamic variables of the battery enables a continuously improved estimate of the remaining discharge time of the battery to be made. Unfortunately, the system is highly dependent on ideal discharge profiles, from which many batteries deviate.

Another method of operation, according to WO 91/08494 is a system that supervises and measures several parameters during discharge, and calculates, with a high sampling frequency, on the basis of algorithms stored in the form of tables, the remaining capacity and the discharge time. On the occasions when the tables do not comprise the values sought for, interpolation is used.

In a third method, according to U.S. Pat. No. 5,371,682, the remaining discharge time and capacity are calculated by means of a curve showing a discharge profile of the battery voltage as a function of the battery capacity spent.

SUMMARY OF THE INVENTION

The state of the art solutions for predicting the remaining discharge time of a battery requires much memory space and computer capacity, using complicated calculations based on curves stored in memory, which furthermore do not always correspond to the discharge characteristics of the battery. The calculations take a long time and the result is not always correct.

The present invention takes into account the discharge parameters determining the shape of the discharge curves for several different discharge currents. The method is compact and thus fast without the need to lose the desired precision. By normalizing the measured values, a table is created, which only needs to hold ten discrete voltage levels and three different discharge currents. By selecting the currents in an appropriate way the table may be used as a starting point for retrieving the remaining capacity in a battery at an arbitrary discharge current, which must be between the highest and the lowest current in the table.

In order to generate a normalized table, three discharges are made with different loads, representing three selected discharge currents. A measurement is made for each discharge, measuring the voltage and the current as a function of time, down to a predetermined final voltage. The measured voltage is divided by the number of battery cells found in the battery, which means that the voltage will be an average value of the individual voltages of all battery cells. In addition, the battery capacity spent is calculated by multiplying the time by the discharge current. When the measurements and the calculations are finished, the voltages are normalized, to enable a correct interpolation between the columns of the table. The equations to normalize the voltages comprise, among other things, the internal resistance of the battery. The last calculation of the capacity spent (at the final voltage) is used to calculate the remaining capacity of the battery, and the remaining capacity is then normalized by division by the nominal 10 h capacity. The currents are normalized in the same way.

Through interpolation of the calculated values for the normalized voltage, and the normalized remaining capacity for each discharge current, the value to be entered into the table is calculated. The currents are entered into the table without being interpolated, as they vary very little.

In order to determine a remaining capacity for an arbitrary discharge current, it is important that the normalized table used be based on the same internal resistance as the one used in the final calculations.

A measurement is made at a point in time $t_l$ when the voltage is $U(t_l)$, the current is $I(t_l)$ and the accumulated capacity is $C_{used}(t_l)$. The voltage is normalized in the same way as before, and a new capacity column is calculated by interpolation of the values found in the table. The remaining capacity is then calculated for the normalized voltage $U_{norm}(t_l)$, through interpolation of the new capacity column.

When this has been done, the status of the battery, which depends, among other things, on how much of the capacity remains in the battery and the voltage measured over the battery, is calculated. The status is used to calculate the resulting remaining capacity, the so called resulting capacity, and the discharge time.

If another final voltage is wanted instead of the one listed in the table, this is compensated for by calculating the remaining capacity for this voltage, which is subtracted from the resulting capacity above.

This calculation is performed on an average value of a number of battery cells in a larger battery, where each battery cell has the same nominal voltage.

The final voltage of each individual cell is then calculated on the basis of the calculated resulting capacity. The average value of all the final voltages is calculated, and the calculated value is compared to the desired final voltage of the battery. If the difference is too big, the resulting capacity is adjusted and a new calculation of the final voltage of the battery is made, the result of which is compared to the desired final voltage, and so on. This iteration is carried out until an acceptable difference between the calculated and the desired final voltage is obtained.

An advantage of the invention is that a very precise calculation of the remaining capacity of a battery may be made with a fast and very simple method.

Another advantage of the method is that it is simple to register the performance of a battery during discharge and to use these values in order to calculate the remaining capacity of the battery in normal operation very precisely, and that it is therefore possible to make a correct decision as to when a battery must be either recharged or replaced.

PREFERRED EMBODIMENTS

Figure 1:
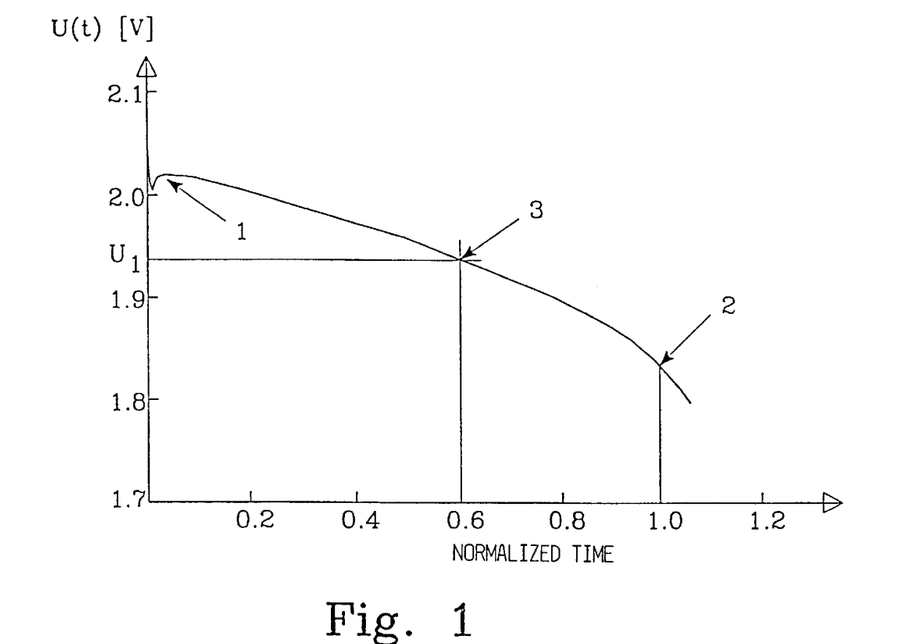
FIG. 1 shows a typical discharge curve for a battery cell at a constant discharge current.

FIG. 1 shows a typical discharge curve for a battery cell having a nominal voltage of 2 V and is being discharged with a constant current. Just at the beginning of the discharge, the voltage drops very fast and then increases to a level called the plateau voltage 1. The time axis has been normalized according to the point in time when the voltage has dropped to a predetermined value, a so called final voltage 2. From this curve the extent of the remaining discharge time of the battery may be obtained by measuring a voltage $U_l$ and then finding the point on the time axis 3 in which the curve has the same value. In this example the value 0.6 is obtained, which means that 40% of the total discharge time remains.

Figure 2:
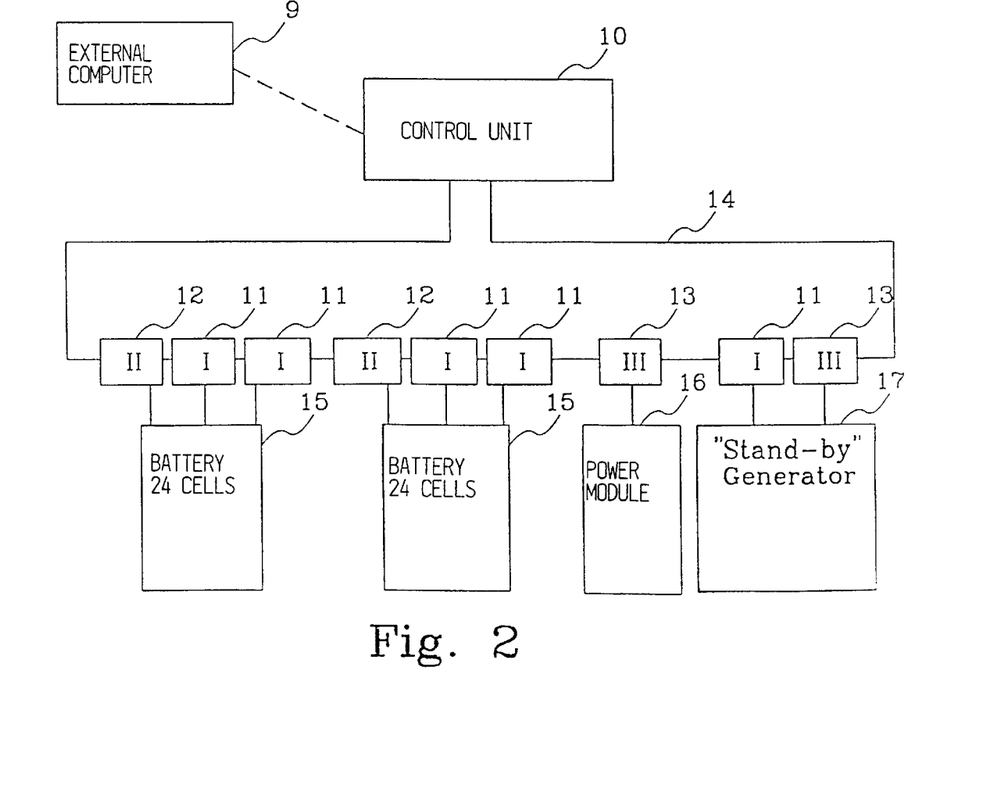
FIG. 2 is a schematic drawing of a battery system comprising a number of units, among them a control unit, which, according to the invention, serves to estimate the remaining discharge time to a predetermined final voltage.

FIG. 2 is a schematic drawing of a battery system comprising a control unit 10, which gathers information and controls the supervision of the battery system via a number of supervision modules of different kinds 11–13. The control unit, which is able to communicate with an external computer 9, is connected to the supervision modules by a communication loop 14, for example a fibre optic loop.

The measurement of the battery voltage of a battery 15 is made through a module I 11. Each module I can measure up to twelve different voltages and thus in this example two module I are needed for each battery comprising twenty-four cells. Module I can also be used to retrieve information from standard sensors with a voltage or current outlet.

The supervision of alarm signals and analogue/digital signals from the batteries is mainly carried out by module II 12.

Equipment not adapted to the battery system can be connected via a module III 13, for example a power module 16 and a "stand-by" generator 17.

Figure 3A:
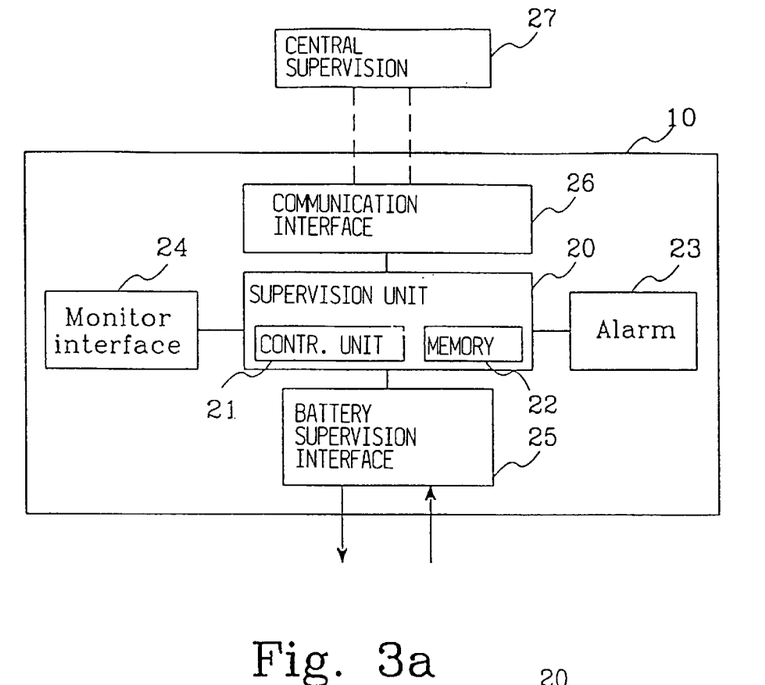
FIGS. 3a and 3b show a flow chart of the control program of the control unit, supervising the battery system shown in FIG. 2.

FIG. 3a shows the control unit 10, represented by a number of function blocks. In the middle of the control unit there is a supervision unit 20 with a control unit 21 and a memory 22. The supervision unit is described in more detail in FIG. 3b.

Connected to the supervision unit 20 is an alarm panel 23, on which the functional status of the battery system can be seen, and a monitor interface 24 to which a terminal can be connected, for example for maintenance tasks. There is also a battery supervision interface 25 through which all communication to and from the individual supervision modules takes place, and a communication interface 26, for example, a modem, to handle the communication with a possible central supervision function 27 in an external computer.

Figure 3B:
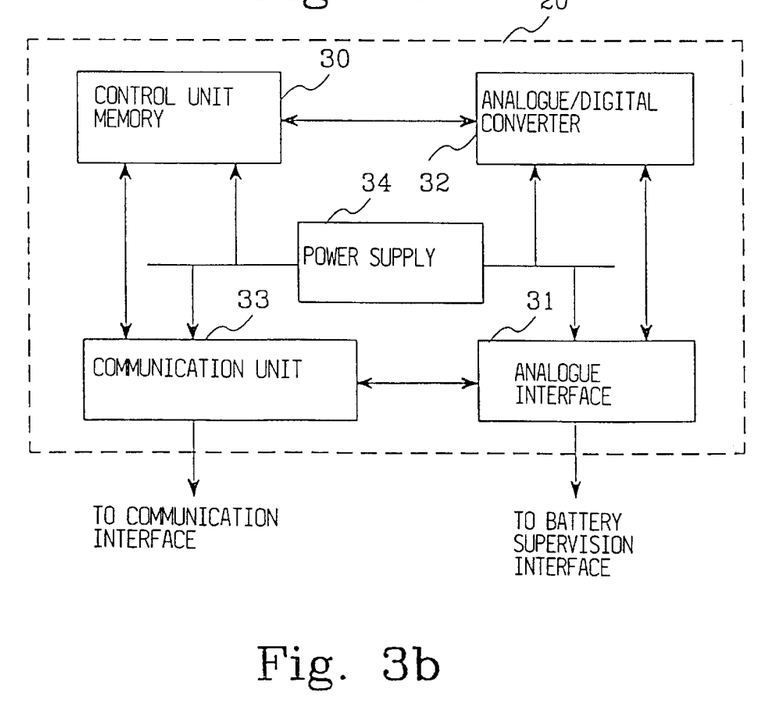

FIG. 3b shows the supervision unit 20, represented by a number of function blocks. In one function block for the control unit/memory 30, program instructions for the battery system are stored, and measured values from the supervision modules are stored and processed according to given instructions. The battery supervision interface is connected to an analogue interface 31, which receives and handles the communication to and from the supervision modules. An analogue/digital converter 32 is placed between the control unit and the analogue interface. The communication interface is connected to a communication unit 33 working towards both the control unit/memory and the analogue interface. A power supply block 34 supplies the supervision unit with electric power.

In the example the communication to and from the supervision modules is analogue, but, of course, digital communication is also possible. In the latter case the analogue interface 31 will be replaced by a digital interface and the A/D converter will not be needed.

Figure 4:
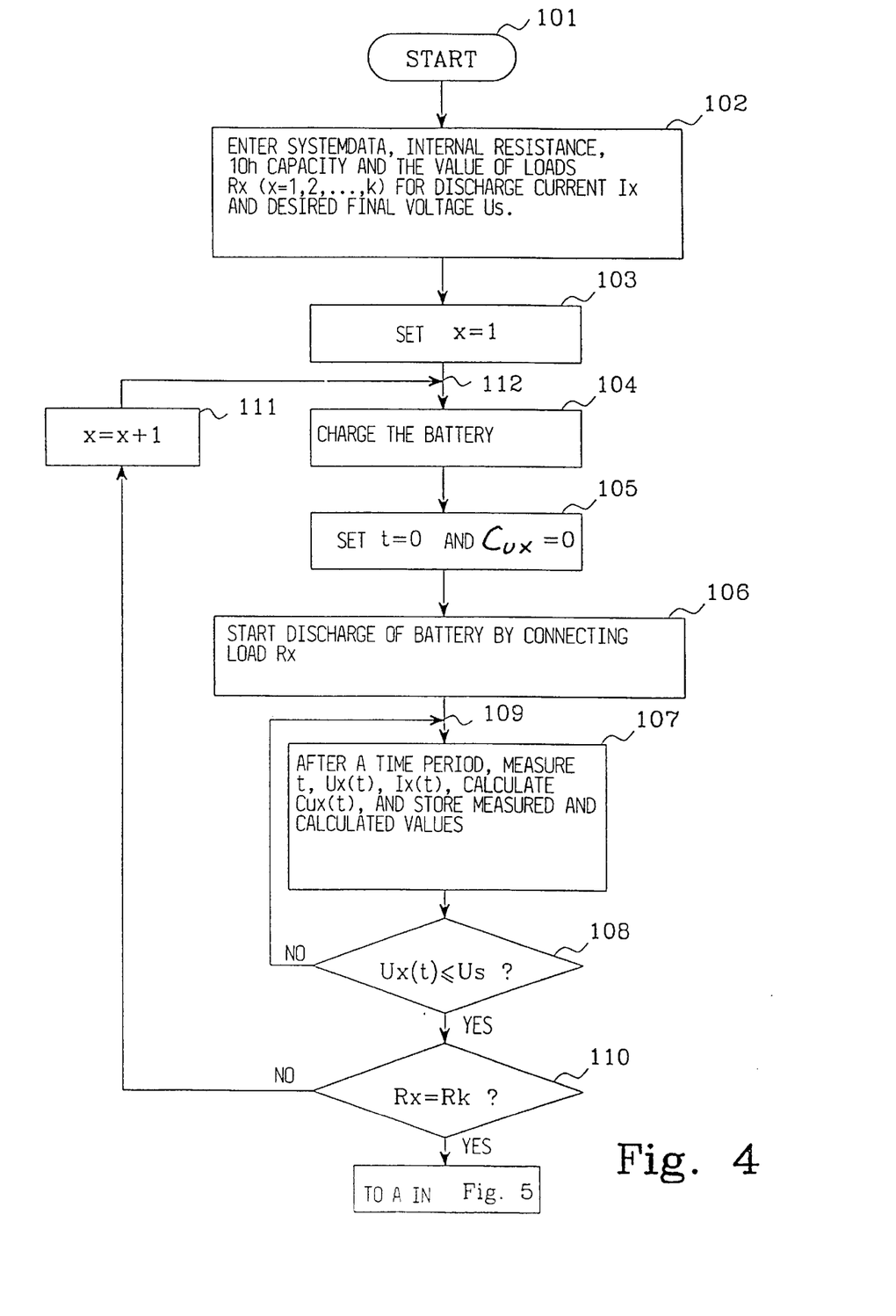
FIGS. 4 and 5 are a flow chart for the retrieval of a normalized table, according to table 1, for determination of the resulting capacity of a battery, according to the invention.
Figure 5:
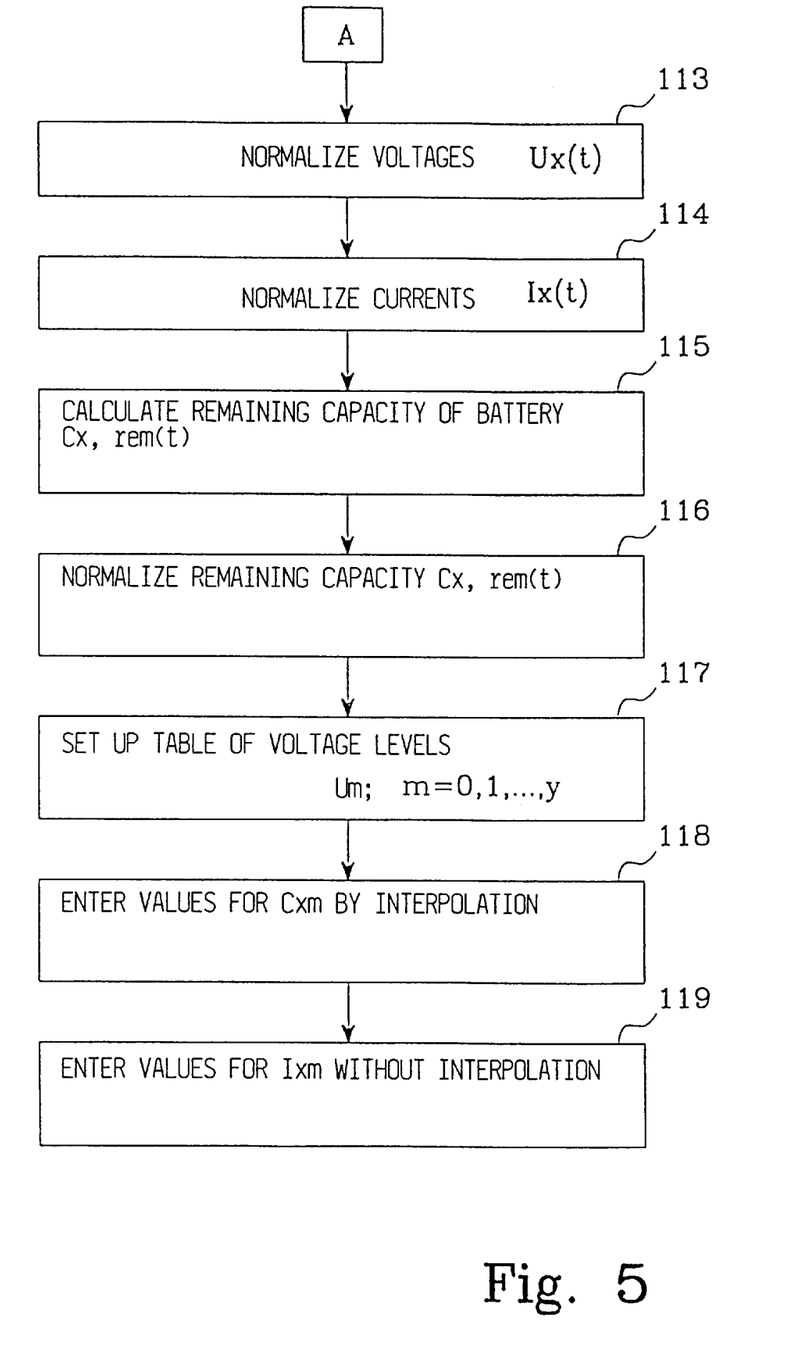

FIGS. 4 and 5 show the method used to obtain a normalized table, which is used as a starting point for calculating a remaining discharge time and a resulting battery capacity. The flow chart gives a detailed picture of the program used to generate the above mentioned table. In this case a battery cell is used having a voltage of 2.1 V when fully charged and a final voltage has been set to 1.75 V. In addition the table is calculated for three current—capacity couples, that is, three loads are used to generate the desired discharge currents. They correspond to discharge times for the battery of 1, 3 and 10 hours, respectively. Of course it is possible to use a greater number of current—capacity couples and other types of battery cells, which will lead to other levels of the maximum and final voltages. The measured battery voltage is an average value from several battery cells.

FIG. 4 shows the beginning of the flow chart for generation of the normalized table, starting with a function block 101 which is activated by a supervision system. Then follows a function block 102 which enables the supervisor of the battery system to enter system data and function parameters. Such information specifically comprises a final voltage $U_s$, at which the battery is considered to be totally discharged, the internal resistance $R_i$ of the battery, the nominal 10 h capacity $C_{10}$ of the battery, the number of columns in the table k and the value of the loads $R_x$ used to generate the desired discharge current $I_x$. These discharge currents are selected especially to correspond to discharge times that give a good precision when using the table and interpolating. In this example, k=3 and the loads have been adapted so that $R_1$ corresponds to a discharge current of 10 hours, $R_2$ corresponds to 3 hours and $R_3$ corresponds to 1 hour.

Instructions in the following function block 103 select the first load $R_i$(x=1). Before discharge can take place the battery is charged for at least 48 hours, and instructions or this and the supervision takes place through a function block 104. Also, important system parameters must be set to zero, such as the discharge time t=0 and the capacity spent $C_{u1}$=0. Instructions for this are executed in a function block 105.

The stored program starts through the functions of a function block 106, and the discharge of the battery starts through connection of the load and start of the time measurements for the discharge of the battery. After a predetermined time interval the flow continues to a function block 107 in which t, $U_l(t)$ and $I_l(t)$ are measured and stored in a memory. The battery capacity spent $C_{ul}(t)$ is also calculated by multiplying the time with the discharge current, and the result is stored in the memory.

If the measured voltage is higher than the stated final voltage a decision is made in a function block 108 to proceed to a point 109 at which a new measurement is made after another time period. This procedure is repeated until the measured voltage is equal to or lower than the final voltage. All the desired values from the first discharge have now been measured and calculated and the flow proceeds to a function block 110, in which the program checks if there are further loads for which the same measurements and calculations should be made.

If there are more loads, the flow is fed back through a function block 111 defining the next load by setting x=x+1, that is, in this case, 2. The flow connects to a point 112 and the stored program starts the sequence of recharging the battery and then performs another measurement series.

When there are no more loads for which measurements should be made, this part is ended and the flow proceeds to FIG. 5 in which a number of calculations will be made in different function blocks to make the desired table complete. First the measured voltages are normalized, at every point in time t in a function block 113 by utilizing the following equations, which are adapted to the stated final voltage for 1.75 V and the maximum voltage of the battery, 2.1 V:

x=1, 2, 3, ..., k $$U_{x,norm} = A + B \cdot U_x \quad (1)$$

$$B = \frac{0.35}{0.35 - R_i \cdot (I_x - I_1)} \quad (2)$$

$$A = 1.75 \cdot (1-B) \quad (3)$$

The normalization is done by maintaining the final voltage of 1.75 V while increasing the plateau voltage by a voltage corresponding to the internal resistance and the difference in currents between the measured discharge current and the 10 h current $I_l$. For the values for the first discharge, which went on for 10 hours, no normalization is done of the voltages; instead they are kept as they were. The result of the normalization is stored in the memory.

When this has been done, the flow proceeds to a function block 114, in which instructions are given for the normalization of the discharge currents, $I_{x,norm}$, by using the following equation in each point in time t:

$$I_{x,norm} = \frac{I_x}{C_{10}}, \quad (4)$$

where x=1, 2, ..., k and $C_{10}$ is the nominal ten hour capacity. In the example, k=3 and the three current columns are normalized and the results are stored in the memory.

Instructions for the next step in the process to generate the normalized table are given in a function block 115 in which the remaining capacity of the battery $C_{x,rem}$ is calculated at each point in time t for the different discharge currents (x=1–3) according to the equation $$C_{x,rem} = C_{x,end} - C_x, \quad (5)$$

in which $C_{x,end}$ is the accumulated spent capacity for a measurement series and $C_x$ is the battery capacity spent up to the time t. The results for all the currents are stored in memory. In a subsequent function block 116 the calculated remaining battery capacities at each time t, are normalized according to the equation:

$$C_{x,rem,norm} = \frac{C_{x,rem}}{C_{10}} \quad (6)$$

The flow now proceeds to the part of the process in which the basic structure of the table is established and instructions on what it should look like are obtained from a function block 117 in which discrete voltage levels $U_m$, m=0–10, are set for the first column. Their respective levels are, for example, 2.10, 2.06, 2.04, 2.02, 2.00, 1.98, 1.95, 1.90, 1.85, 1.80, 178, that is, $U_0$=2.10 V and $U_5$=1.98 V. Of course other voltage levels may be used. No row is found in the table for the final voltage 1.75 V, as the remaining capacity is calculated for this final voltage, and the result is zero. The final table according to this example may be seen below, in table 1.

When the basis for the table has been created, it is to be filled, and instructions for this operation are found in a function block 118 handling the entering of the remaining normalized battery capacities and a function block 119 handling entering of the normalized discharge currents.

The procedure of entering the remaining battery capacities is carried out for each discharge current and row m=0–10 in the table according to instructions found in the function block 118, whereby the normalized remaining capacity column is used with the associated voltage columns from the registered calculations in the memory, and the following equation is used:

$$C_m = C_r + C_{r+1} \cdot (U_m - U_r) \cdot \frac{C_{r+1} - C_r}{U_{r+1} - U_r}, \quad (7)$$

in which $C_r$ is the value of the normalized remaining capacity and $U_r$ is the normalized voltage from row r. $U_r$ is the voltage immediately above the desired discrete voltage $U_m$ for which the interpolation is made. In the same way, $C_{r-1}$ and $U_{r-1}$ are retrieved from memory, where $U_{r+1}$, is the voltage immediately below the discrete voltage $U_m$.

The flow is ended in the next function block 119, in which the values for the discharge currents are entered into the table. In contrast to the capacity, these values do not have to be interpolated, as the value of the different currents do not vary very much during a measurement series. Of course, it is possible to interpolate according to equation (7) if desired, but replacing the capacity with the current. The flow can now generate a normalized table, see table 1.

TABLE 1

A normalized table for implementation example

| row | Voltage $U_m$ | 10h discharge | | 3h discharge | | 1h discharge | |
|---|---|---|---|---|---|---|---|
| | | $I_{1m}$ | $C_{1m}$ | $I_{2m}$ | $C_{2m}$ | $I_{3m}$ | $C_{3m}$ |
| 0 | 2.10 | $I_{10}$ | $C_{10}$ | $I_{20}$ | $C_{20}$ | $I_{30}$ | $C_{30}$ |
| 1 | 2.06 | $I_{11}$ | $C_{11}$ | $I_{21}$ | $C_{21}$ | $I_{31}$ | $C_{31}$ |
| 2 | 2.04 | $I_{12}$ | $C_{12}$ | $I_{22}$ | $C_{22}$ | $I_{32}$ | $C_{32}$ |
| 3 | 2.02 | $I_{13}$ | $C_{13}$ | $I_{23}$ | $C_{23}$ | $I_{33}$ | $C_{33}$ |
| 4 | 2.00 | $I_{14}$ | $C_{14}$ | $I_{24}$ | $C_{24}$ | $I_{34}$ | $C_{34}$ |
| 5 | 1.98 | $I_{15}$ | $C_{15}$ | $I_{25}$ | $C_{25}$ | $I_{35}$ | $C_{35}$ |
| 6 | 1.95 | $I_{16}$ | $C_{16}$ | $I_{26}$ | $C_{26}$ | $I_{36}$ | $C_{36}$ |
| 7 | 1.90 | $I_{17}$ | $C_{17}$ | $I_{27}$ | $C_{27}$ | $I_{37}$ | $C_{37}$ |
| 8 | 1.85 | $I_{18}$ | $C_{18}$ | $I_{28}$ | $C_{28}$ | $I_{38}$ | $C_{38}$ |
| 9 | 1.80 | $I_{19}$ | $C_{19}$ | $I_{29}$ | $C_{29}$ | $I_{39}$ | $C_{39}$ |
| 10 | 1.78 | $I_{110}$ | $C_{110}$ | $I_{210}$ | $C_{210}$ | $I_{310}$ | $C_{310}$ |

Figure 6:
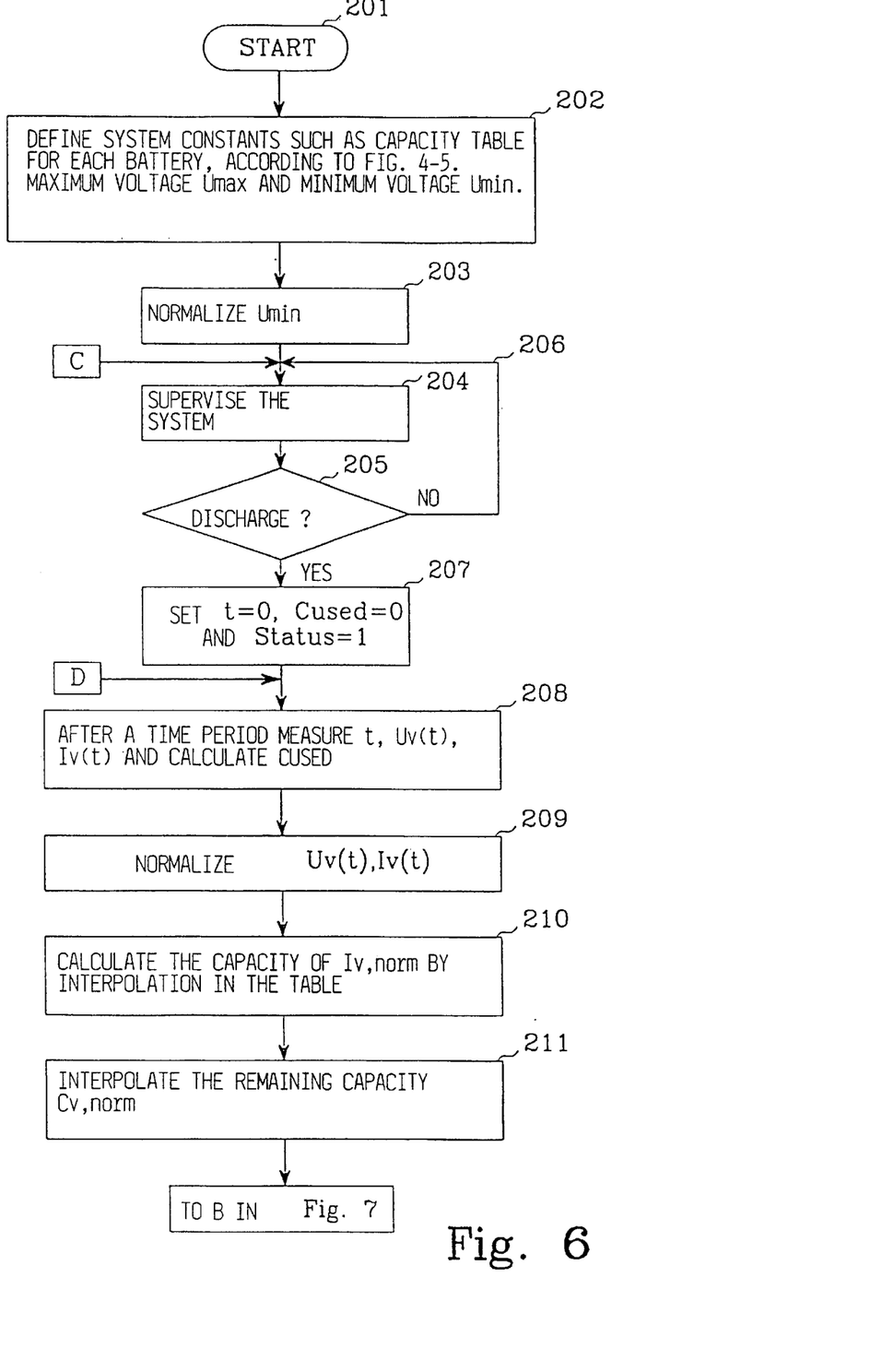
FIGS. 6 and 7 are a flow chart for the retrieval of the resulting capacity of a battery and the calculation of the estimated remaining discharge time, according to the invention.
Figure 7:
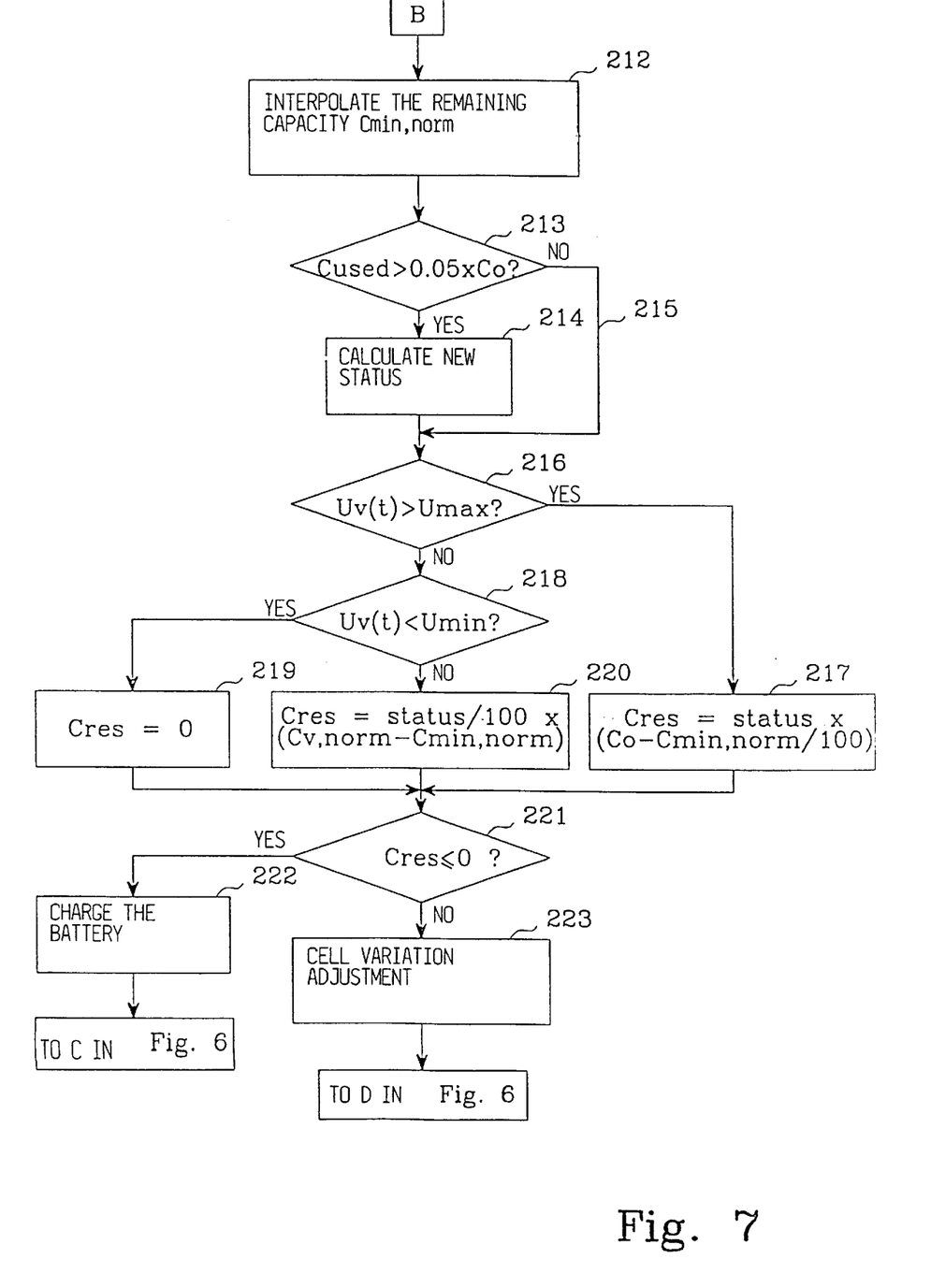

FIGS. 6 and 7 show the technology used in order to calculate, based on a measurement of the voltage $U_x(t)$ and discharge current $I_x(t)$ of a battery, the resulting capacity and discharge time down to a predetermined minimum voltage $U_{min}$. The basis for these calculations is the normalized table obtained in FIGS. 4 and 5.

FIG. 6 shows the beginning of a flow chart for calculation of the resulting capacity and thereby the discharge time initiated by a function block 201, which is activated by a supervision system. Then follows a function block 202 giving the supervisor of the battery system a possibility to enter system data and functional parameters. Such information comprises the normalized capacity table for the battery for which the discharge is to be supervised, obtained according to FIGS. 4 and 5. Associated with the table the value of the final voltage $U_s$, in which the battery is considered completely discharged, is found. Further a constant, $U_{max}$, is entered, which is used in subsequent calculations to determine the right status. Also, a minimum voltage, $U_{min}$, may be entered, which functions as a new final voltage. If no minimum voltage is entered, the minimum voltage is set to be equal to the final voltage.

The flow then proceeds to a function block 203, in which the stored program gives instructions to normalize the entered minimum voltage $U_{min,norm}$, by using the equations (1)–(3) and then proceed with instructions to supervise the battery system in a function block 204 to determine if the battery is being discharged. A discharge decision is made in a function block 205, and if this is not the case, the flow goes back, through a feed back 206 to the function block 204. This is repeated until a discharge is detected and the flow proceeds to a function block 207, in which the program orders the setting of certain parameters to predetermined values. The time for the discharge is set to zero, the value of the estimated battery capacity spent $C_{used}$ is set to zero, and the value of the status is set to 1.

In the following function block 208 instructions are given to wait a predetermined period of time before a first measurement of a battery voltage $U_v$ and a discharge current $I_v$ as a function of time is made. Then an accumulated capacity spent is calculated. All values are stored in a memory. To be able to calculate the correct resulting capacity, the measured battery voltage must be normalized by means of the equations (1)–(3) and the measured discharge current must be normalized by means of the equation (4). This is done in a function block 209.

The flow proceeds to a function block 210 in which a new capacity column is calculated from the normalized table. This operation is performed by interpolation with the following equation:

$$C_{vm}=C_{cm}+(I_{v,norm}-I_{cm})\cdot(C_{(c+1)m}-C_{cm})/(I_{(c+1)m}-I_{cm}) \quad (8)$$

in which m is an index for each row in the table. $I_{cm}$ and $I_{(c+1)m}$ are the current from row m in the current column of the table immediately lower and higher, respectively, than the normalized current $I_{v,norm}$. $C_{cm}$ and $C_{(c+1)m}$ are the corresponding values of the remaining capacity. The results are stored in memory.

Then follows a function block 211 in which a value of the remaining normalized capacity is calculated using the following equation:

$$C_{v,norm}=C_{vn}+(U_{v,norm}-U_n)\cdot(C_{v(n+1)}-C_{vn})/(U_{n+1}-U_n) \quad (9)$$

in which $U_n$ and $U_{n+1}$ are voltages from the row in the voltage column of the table immediately above and below, respectively, the normalized voltage $U_{v,norm}$. $C_{vn}$ and $C_{v(n+1)}$ are the corresponding values for the remaining capacity. The result is stored in memory.

When the new capacity column for the measured current has been calculated the flow proceeds to FIG. 7 and a function block 212 in which a normalized remaining capacity $C_{min,norm}$, corresponding to the normalized minimum voltage $U_{min,norm}$, is calculated through interpolation based on the new capacity column using equation (9). $C_{v,norm}$ is replaced by $C_{min,norm}$ and $U_{v,norm}$ is replaced by $U_{mn,norm}$ in the equation. This result is also stored in memory.

In order to calculate a resulting capacity $C_{res}$ for the battery, the status of the battery must be obtained. In a function block 213 it is determined whether the battery is at the beginning of the discharge by comparing the accumulated spent capacity $C_{used}$ to a value for the total capacity $C_0$ of the battery for the current $I_v$, when $U_v=2.1$ V. If $C_{used}$ is more than 5% of $C_0$, the flow proceed to a function block 215 in which a new status for the battery is calculated according to the equation:

$$\text{Status}=100\cdot C_{used}/(C_0-C_{v,norm}) \quad (10)$$

The flow then proceeds to a function block 216. In the cases when $C_{used}$ is smaller than 5% of $C_0$ the flow passes through a bypass connection 215 to the function block 216. In the block 216, the stored program compares the measured battery voltage $U_v(t)$ to the entered maximum voltage $U_{max}$. If $U_v(t)>U_{max}$, the flow proceeds to a function block 217 in which the resulting capacity $C_{res}$ of the battery is calculated using the following equation:

$$C_{res}=\text{status}\cdot(C_0-C_{min,norm}/100) \quad (11)$$

The equation takes into account, and compensates for, another minimum voltage than the final voltage stated in the table. In the cases when the minimum voltage is equal to the final voltage, $C_{min,norm}=0$ and does not affect the calculation of $C_{res}$.

If the decision in the function block 216 is the opposite, that is, the measured voltage is not greater than the maximum voltage, the flow instead continues to a function block 218 to determine if the voltage has dropped too much. If the measured battery voltage $U_v(t)$ is lower than the minimum voltage $U_{min}$, the flow proceeds to a function block 219 in which the program gives instructions to set the resulting capacity to zero.

If the measured battery voltage $U_v(t)$ is higher than the minimum voltage $U_{min}$ the flow proceeds to a function block 220 in which a value for the resulting capacity is calculated using the following equation:

$$C_{res}=\text{status}/100\cdot(C_{v,norm}-C_{min,norm}), \quad (11)$$

which also takes into account and compensates for a minimum voltage differing from the final voltage stated in the table. The result from the calculation of the resulting capacity in the function blocks 217, 219 and 220 are moved to a function block 221. If $C_{res}$ is smaller than or equal to zero, the flow proceeds from the function block 221 to a function block 222, in which the battery is disconnected from the system and recharged. When it is fully charged, the flow returns to the letter C in FIG. 6.

If $C_{res}$ is greater than zero, the flow proceeds to a function block 223, in which a cell variation adjustment takes place. The function has been described in detail in FIG. 8. After the adjustment has been done, the flow is fed back to the letter D in FIG. 6 and a new measurement is made of the battery voltage and the discharge current after a determined time period.

Figure 8:
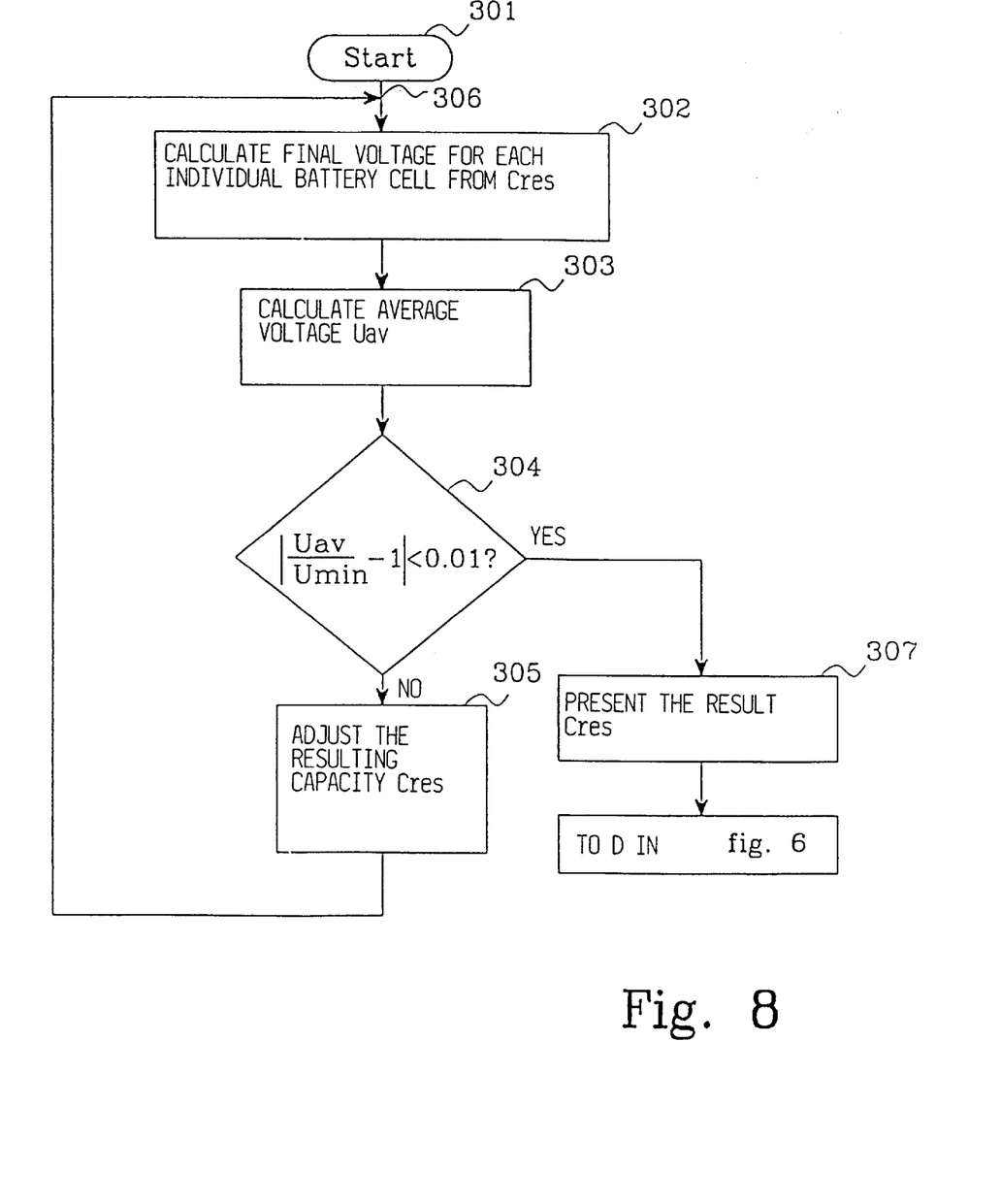
FIG. 8 is a flow chart for the adjustment of the resulting capacity when the desired final voltage is taken into account.

FIG. 8 is a detailed flow chart of the function block 223, in which calculations are carried out to adjust the resulting capacity so that the desired final voltage of the battery corresponds to the calculated final voltage of the battery. By final voltage is meant the voltage at which the battery is considered empty and must be recharged, the so called minimum voltage, $U_{min}$.

The flow chart for the adjustment is initiated in a function block 301, which is activated by the supervision system. Then follows a function block 302 giving instructions to calculate the final voltage $U_e$ of each individual battery cell, if the resulting capacity $C_{res}$ is given. This calculation is made using the following equation:

$$U_e = \frac{U_n + (U_{n+1} - U_n) \cdot (C_{rem} - C_{vn})/(C_{v(n+1)} - C_{vn}) - A}{B}, \quad (12)$$

in which $U_n$ and $U_{n+1}$ are voltages from the row in the voltage column of the table immediately above and below, respectively, the normalized voltage $U_{v,norm}$. $C_{vn}$ and $C_{v(n+1)}$ are the corresponding values of the remaining capacity. A and B are retrieved from the equations (2) and (3). The results from the calculations are stored in memory.

In a function block 303 instructions are given to calculate an average final voltage in the battery $U_{av}$ by calculating the average value of the calculated final voltage of all cells. The result is stored in memory and the flow proceeds to a function block 304 in which a comparison is made between the average final voltage of the battery and the desired final voltage. If the average final voltage differs more than 1% from the desired final voltage, instructions are given in a subsequent function block 305 to adjust the resulting capacity according to the following equation:

$$C_{res}(x+1) = C_{res}(x) \cdot \left(1 + \frac{U_{av} - U_{min}}{U_{v,norm} - U_{min}}\right), \quad (13)$$

in which $C_{res}(x+1)$ denotes a new calculated resulting capacity for the battery and $C_{res}(x)$ denotes the calculated resulting capacity, to be adjusted. The flow is fed back to the point 306 and a new calculation is made of the final voltage of the cells. This iteration proceeds until the value of the calculated final voltage of the battery lies within 1% of the desired final voltage. When this happens, the flow proceeds from the function block 304 to a function block 307 in which the results of all calculations are presented, for example, the resulting capacity, discharge current, battery voltage, desired final voltage and discharge time. In addition it may be retrieved from this information how long time remains before the battery must be recharged by dividing the resulting capacity with the discharge current, supposing this current is constant.

Then the flow is fed back to D in FIG. 6 in order to measure the discharge time, the battery voltage and the discharge current again.

The method for calculating and adjusting the resulting capacity enables the use of battery cells of different status and even with different internal resistance. The flow becomes a little more complicated, but the principle is the same.

The invention is of course not restricted to the embodiments described above and shown in the drawings, but may be modified within the scope of the patent claims.

I claim:

1. A method for calculating a resulting capacity of a battery, characterized in that it comprises two parts, of which a first part comprises retrieving values from at least two discharge curves, in which the retrieved values are normalized and a second part comprises a calculation of the resulting capacity of the battery from the retrieved normalized values from the first part, wherein the discharge curves are a battery voltage as a function of time, that the battery capacity spent is calculated from the discharge curves, and that the first part of the method comprises the following steps:

adapting each discharge curve to correspond to a specified approximate discharge current, measuring and registering the discharge current and the battery voltage during the discharge process of the battery, and calculating a remaining battery capacity for each measurement of the discharge current and battery voltage from the battery capacity spent.

2. A method according to claim 1, characterized in that the first part of the method comprises the following additional steps:

arranging the obtained normalized values in a table in which a first column comprises at least two discrete voltage levels, entering a current column and a capacity column, for the remaining battery capacity into the table by interpolation of the measured/calculated values for each discharge curve.

3. A method according to claim 2, characterized in that there are three discharge curves, arranged to correspond to a discharge time for the battery of one, three, and ten hours respectively, whereby the discharge time is taken from the time of discharge until the battery voltage has dropped to a defined final voltage and that there are at least ten discrete voltage levels in the table.

4. A method according to claim 1, characterized in that the second part of the method comprises the following steps:

arranging a table, obtained through a number of controlled discharges according to the first part of the method, to correspond to the discharge process for each cell in the battery, setting the discharge time for the battery and the capacity spent to zero when the battery is being connected, measuring and registering a discharge current and a battery voltage of a battery during the discharge process after a certain discharge time, calculating the battery capacity spent from the discharge time and the discharge current and normalizing the capacity spent, the battery voltage and the discharge current, interpolating a normalized remaining capacity from a new capacity column, which is obtained by interpolating the contents of two adjacent normalized capacity columns from the table, calculating a status from each cell in the battery by using the value of the normalized remaining capacity, the capacity spent and the total capacity of the cell, calculating the resulting capacity by using the value of the status and the remaining capacity/the total capacity of the cell.

5. A method according to claim 4, characterized in that the second part of the method comprises the following additional steps:

defining a minimum voltage which may differ from the final voltage given in the table, and which is arranged to determine the voltage at which the discharge process of the battery should be interrupted, normalizing the minimum voltage to enable the calculation of a normalized minimum capacity by interpolation of the content of the new capacity column, calculating a resulting minimum capacity by using the value of the status, adjusting the resulting capacity by subtracting the minimum capacity, which leads to a compensation because of the changed final voltage.

6. A method according to claim 4, characterized in that the second part of the method comprises the following additional steps:

calculating a final cell voltage from the resulting capacity and the normalized measured battery voltage by interpolating the cell voltage from the obtained table, calculating an average final voltage from the final cell voltages, adjusting the resulting capacity by iteration with regard to the resulting capacity and the final cell voltage until an acceptable difference between the average final voltage and the stated minimum voltage is obtained.

7. A control unit for calculating the resulting capacity of a battery, characterized in that it comprises means for obtaining values from at least two discharge curves, normalizing the obtained values, calculating the resulting capacity of the battery from the normalized values calculating the battery capacity spent during discharge, from the obtained values for each discharge curve, registering the discharge current of the respective discharge curve, calculating the remaining battery capacity from the capacity spent, obtaining a table with at least two discrete voltage levels, entering the normalized remaining capacity into the table by interpolation of the normalized calculated values, entering the normalized discharge current into the table.

8. A control unit according to claim 7, characterized in that it also comprises means for registering the discharge current and battery voltage of a battery at a certain point in time, during normal operation, calculating the battery capacity spent, normalizing the discharge current and battery voltage of the discharge curve, calculating the remaining capacity by interpolation in the table, calculating a status for the battery, calculating a resulting capacity from the value of the status and the remaining capacity.

9. A control unit according to claim 7, characterized in that it comprises additional means for calculating a final voltage for each individual battery cell in the battery from the resulting capacity and the normalized measured battery voltage by interpolating the cell voltage from the obtained table, calculating an average final voltage from the calculated final cell voltages, adjusting the resulting battery capacity by iterations with respect to the resulting capacity and the average final voltage.

10. A battery system for calculating the resulting capacity of a battery according to the method of claim 1, characterized in that it comprises a control unit (10), at least one module I (11) for measuring signals and at least one module II (12) for supervising the battery (15).

* * * * *